United States Patent [19]
Underwood et al.

[11] 3,935,582
[45] Jan. 27, 1976

[54] SELENIUM RECTIFIER

[75] Inventors: John Duckles Underwood, Bishop Stortford; David George Watts, Roydon, both of England

[73] Assignee: International Standard Electric Corporation, New York, N.Y.

[22] Filed: June 6, 1974

[21] Appl. No.: 477,139

[30] Foreign Application Priority Data
June 19, 1973 United Kingdom............... 28929/73

[52] U.S. Cl. .................................. 357/11; 427/83
[51] Int. Cl.² .................................... H01L 29/18
[58] Field of Search......................... 357/11; 427/83

[56] References Cited
UNITED STATES PATENTS

| | | | |
|---|---|---|---|
| 2,806,984 | 9/1957 | Koch.................................. | 357/11 |
| 2,956,218 | 10/1960 | Kleinle et al.......................... | 357/11 |
| 3,052,572 | 9/1962 | Hase .................................. | 357/11 |

*Primary Examiner*—William D. Larkins
*Attorney, Agent, or Firm*—John T. O'Halloran; Menotti J. Lombardi, Jr.; Vincent Ingrassia

[57] ABSTRACT

This invention relates to selenium rectifiers and a method of making them. Using techniques of electrophoretic deposition of selenium, a selenium rectifier is manufactured having a barrier layer adjacent the base electrode. This results in a cheaper rectifier with improved heat dissipation.

9 Claims, 1 Drawing Figure

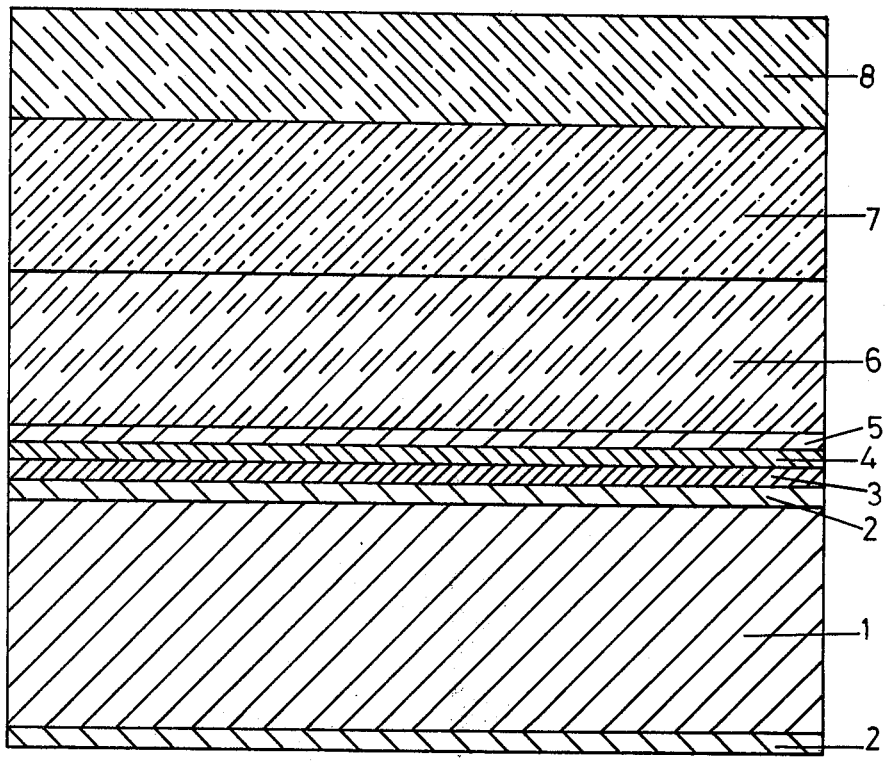

SELENIUM RECTIFIER

BACKGROUND OF THE INVENTION

This invention relates to selenium rectifiers and to a method of making them.

A conventional selenium rectifier consists of a metal plate, which acts as the rectifier base electrode, upon one side of which there are deposited, usually by evaporation techniques, layers of selenium with either a halogen additive, such as chlorine, or doped with a metal such as gallium or indium, or both an additive and a dopant. These layers of selenium may be sandwiched with relatively thin layers of various metals such as nickel between the selenium and the base electrode. The counter electrode is generally an alloy such as a cadmium tin alloy. Rectification takes place in a barrier layer which is adjacent the counter electrode. Such rectifiers are reliable but the evaporation apparatus is costly to install and maintain.

SUMMARY OF THE INVENTION

It is an object of the present invention to provide a selenium rectifier, in which the barrier layer constituted by the amorphous selenium is adjacent the base electrode rather than the counter electrode, by electrophoretically depositing the selenium layers. The electrophoretic deposition of selenium is a relatively rapid process compared with evaporation techniques, and does not require costly apparatus.

According to a broad aspect of the invention, there is provided a selenium rectifier comprising a metal plate base electrode; at least one metal layer deposited on one surface of said metal plate, said metal layer consisting of a metal different than that of said metal plate; a first layer of amorphous selenium on said at least one metal layer; a second layer of selenium containing a first halogen additive, said second layer deposited on said first layer; a third layer of selenium containing a second halogen additive and a metallic dopant, said third layer deposited on said second layer; and a metal counter electrode layer deposited on said third layer.

BRIEF DESCRIPTION OF THE DRAWINGS

The above and other objects of the present invention will be more clearly understood from the following detailed description taken in conjunction with the accompanying drawing which illustrates the structure of the rectifier.

DESCRIPTION OF THE PREFERRED EMBODIMENTS

An aluminium plate 1 is first electroplated on both sides with a layer of nickel 2, of 10–20 $\mu$ thickness. One side of the plate is then masked with an insulating material to prevent further deposition by subsequent electroplating or electrophoretic processes. On the unmasked side of the plate a layer of cadmium 3 is next electroplated to a thickness of 10–20 $\mu$ preferably from a fluoroborate solution. This is followed by an electroplated layer of thallium 4 which is only about 0.5 $\mu$ thick.

The plate is now ready for electrophoretic deposition of selenium. For this three separate sols are required.

The first sol is prepared by chemical reduction of a methanolic solution of selanous acid ($H_2Se_eO_3$) containing a trace of selenium dioxide to ensure that the solution is anhydrous. Various organic reducing agents containing an aromatic ring may be employed for this purpose, but benzaldehyde is preferred as a stable sol results from its use. Each mole of selenous acid requires two moles of benzaldehyde for its reduction to colloidal red selenium, and the resultant clear yellow sol can be diluted with more methanol or other alcohols such as glycerol or ethylene glycol.

Using this first sol a layer of amorphous selenium 5 is deposited by normal electrophoretic techniques, the thickness of this layer being about 2 – 3 $\mu$.

A second sol is then prepared by first grinding selenium into which chlorine has been fused as a halogen additive.

The second selenium sol is prepared by a partly mechanical process. Gray or metallic selenium is prepared, by a conventional fusion process, containing a dopant such as gallium and/or indium, or with an additive such as chlorine together with a dopant. The selenium is ground and is then passed through a colloid mill with a dispersant liquid such as glycerol. A small quantity of a suspectant may also be added to prevent agglomeration of the selenium particles. Methanol is added to the sol which is then mixed with 100 vol hydrogen peroxide at the rate of 15 cc per 25 g selenium and stirred for 4 hours at 40–50°C after which benzaldehyde is added to the sol. Other organic aldehydes containing an aromatic ring may be employed but benzaldehyde is again preferred as it produces a stable sol. The nature of the oxidation and reduction steps are not fully understood but it is thought that the hydrogen peroxide produces a surface layer of selenium dioxide on the selenium sol particles which layer is then reduced to red selenium by the benzaldehyde.

The sol is allowed to settle and surplus liquid is decanted. An alcohol such as amyl alcohol is added together with an antiflocculating agent such as DUOMEE TDM (Registered Trade Mark) which may also charge the sol particles.

Using a mixture of a small quantity of the first sol and a large quantity of the second sol a further layer of selenium 6 is deposited by normal electrophoretic techniques, the thickness of this layer being about 50 $\mu$.

A third sol is then prepared in exactly the same manner as the second sol, except that the selenium is doped with either gallium or indium as well as having the halogen additive. The grinding and subsequent steps are the same as for the second sol.

Using a mixture of a small quantity of the first sol and a large quantity of the third sol a final layer of selenium 7 is then deposited, once again using normal electrophoretic techniques, to a thickness of about 50 $\mu$. The selenium coated plate is then heat treated above 217°C to fuse the selenium.

Lastly, a metal alloy of either tin/bismuth or tin/bismuth/indium is sprayed on to form the counter electrode layer 8 and heated to about 200°C. The masked side of the base electrode is then cleaned and the rectifier is electrically formed in the usual manner.

The barrier layer, which is provided by the amorphous selenium layer 5, is now adjacent the base electrode, and rectification takes place therefore near the aluminium plate. This results in improved heat dissipation.

It is to be understood that the foregoing description of specific examples of this invention is made by way of example only and is not to be considered as a limitation on its scope.

What is claimed is:

1. A selenium rectifier comprising:
   a metal plate base electrode;
   at least one metal layer deposited on one surface of said metal plate, said metal layer consisting of a metal different than that of said metal plate;
   a layer of cadmium on said metal layer;
   a layer of thallium on said cadmium layer;
   a first layer of amorphous selenium on said thallium layer;
   a second layer of selenium containing a halogen additive, said second layer deposited on said first layer;
   a third layer of selenium containing a halogen additive and a metallic dopant, said third layer deposited on said second layer; and
   a metal counter electrode layer deposited on said third layer.

2. A selenium rectifier according to claim 1 wherein said base electrode is aluminium.

3. A selenium rectifier according to claim 2 wherein said metal layer is nickel deposited by electroplating.

4. A selenium rectifier according to claim 3 wherein said counter electrode is an alloy consisting of tin and bismuth, said alloy deposited by spraying.

5. A selenium rectifier according to claim 3 wherein said counter electrode layer is an alloy consisting of tin, bismuth and indium, said alloy deposited by spraying.

6. A selenium rectifier according to claim 3 wherein said halogen additive is chlorine.

7. A selenium rectifier according to claim 6 wherein dopant is gallium.

8. A selenium rectifier according to claim 6 wherein said dopant is indium.

9. A selenium rectifier according to claim 1 wherein said first, second and third layers are electrophoretically deposited.

* * * * *